United States Patent [19]
Mabuchi

[11] Patent Number: 6,104,237
[45] Date of Patent: Aug. 15, 2000

[54] METHOD FOR ESTIMATING PHASE IN DEMODULATOR

[75] Inventor: Tetsuo Mabuchi, Tokyo, Japan

[73] Assignee: NEC Corporation, Tokyo, Japan

[21] Appl. No.: 09/291,998

[22] Filed: Apr. 15, 1999

[30] Foreign Application Priority Data

Apr. 15, 1998 [JP] Japan .................................. 10-105232

[51] Int. Cl.[7] ............................. H03D 3/00; H04L 27/22
[52] U.S. Cl. ......................... 329/307; 329/308; 375/327; 375/329; 375/365; 375/376
[58] Field of Search ............... 329/302, 307–309, 329/325, 326, 360; 375/327, 329, 333, 365–368, 376

[56] References Cited

U.S. PATENT DOCUMENTS

| | | | |
|---|---|---|---|
| 4,466,108 | 8/1984 | Rhodes | 375/83 |
| 5,170,415 | 12/1992 | Yoshida et al. | 375/80 |
| 5,815,541 | 9/1998 | Fukushi | 375/376 |

*Primary Examiner*—David Mis
*Attorney, Agent, or Firm*—Young & Thompson

[57] ABSTRACT

A signal from a local oscillator is separated by a 90° phase sifter into an in-phase component and an orthogonal component. Each of the components is multiplied by a received IF signal in a mixer to perform pseudo-synchronous detection. The pseudo-synchronously detected signals are subjected to A/D conversion in an A/D converter, and preamble portions are integrated in integrating circuits. The integrated signals are latched in latch circuits. The timing of the latch is controlled by a timing circuit. A power detector detects the power of the latched signal, and the maximum value is detected in a maximum value detector to determine timing at which the power becomes maximum in selectors. A phase ($\theta$) is determined from the inverse tangent of the maximum value, and is used as an initial value of a voltage controlled oscillator (VCO) in a demodulator. By virtue of the above construction, a method for estimating a phase in a demodulator can be provided which can accurately demodulate a received burst signal with small circuit size and memory.

4 Claims, 6 Drawing Sheets

METHOD FOR ESTIMATING PHASE IN DEMODULATOR

FIELD OF THE INVENTION

The invention relates to a method for estimating a phase in demodulators used in radio communications, and more particularly to a method for estimating a phase in demodulators that estimates the phase through the utilization of a preamble portion and can stably demodulate a burst signal.

BACKGROUND OF THE INVENTION

In burst demodulators for radio signals, the pulling speed of PLL (phase locked loop) should be increased to accurately demodulate burst signals. For this reason, in a conventional method for estimating a phase in a burst demodulator, the phase of a burst signal is estimated, and the phase is used as an initial value of VCO (voltage controlled oscillator) in PLL. In this case, the phase of the burst signal is determined based on correlation of received burst signals determined using a parallel correlator.

Thus, according to the conventional method for estimating a phase in a burst demodulator, in demodulation of a burst signal, the phase of a burst signal is estimated based on correlation of received burst signals determined using a parallel correlator, the estimated phase is utilized as the initial value of VCO in PLL to increase the pulling speed in PLL.

According to the conventional method for estimating a phase in a burst demodulator, however, since the phase is estimated by determining correlation of burst signals in a parallel correlator, a memory capacity corresponding to a value obtained by multiplying the number of preambles by the number of samples is necessary. This poses a problem of an increased size of the circuit.

SUMMARY OF THE INVENTION

Accordingly, it is an object of the invention to provide a method for estimating a phase in a demodulator which can accurately demodulate a received signal without the necessity of increasing the size of the circuit and the memory capacity.

According to the first feature of the invention a method for estimating a phase in a demodulator, comprises the steps of: estimating a phase of a demodulated signal, obtained by demodulating a received signal, based on integrated values of the predetermined number of samples of a plurality of symbols constituting a preamble of the received signal; and feeding the phase of the demodulated signal as an initial phase into a voltage controlled oscillator (VCO) in a phase locked loop contained in a demodulator for outputting the demodulated signal.

According to the second feature of the invention, a method for estimating a phase in a demodulator comprises the steps of: pseudo-synchronously detecting a received burst signal by an in-phase component and an orthogonal component of a local oscillation signal;

converting the pseudo-synchronously detected signals to digital signals;

integrating the digital signals with respect to the predetermined number of samples;

latching the signals integrated with respect to the predetermined number of samples at predetermined timing;

detecting the maximum value of the in-phase component and the orthogonal component in the latched signals; and estimating, from the maximum value, a phase to be used as an initial phase value of a phase locked loop (PLL) in a demodulator for the burst signal.

BRIEF DESCRIPTION OF THE DRAWINGS

The invention will be explained in more detail in conjunction with appended drawings, wherein.

DESCRIPTION OF THE PREFERRED EMBODIMENTS

The method for estimating a phase in a demodulator in the preferred embodiments of the invention will be explained in more detail in conjunction with FIGS. 1 to 6.

Figure 1:
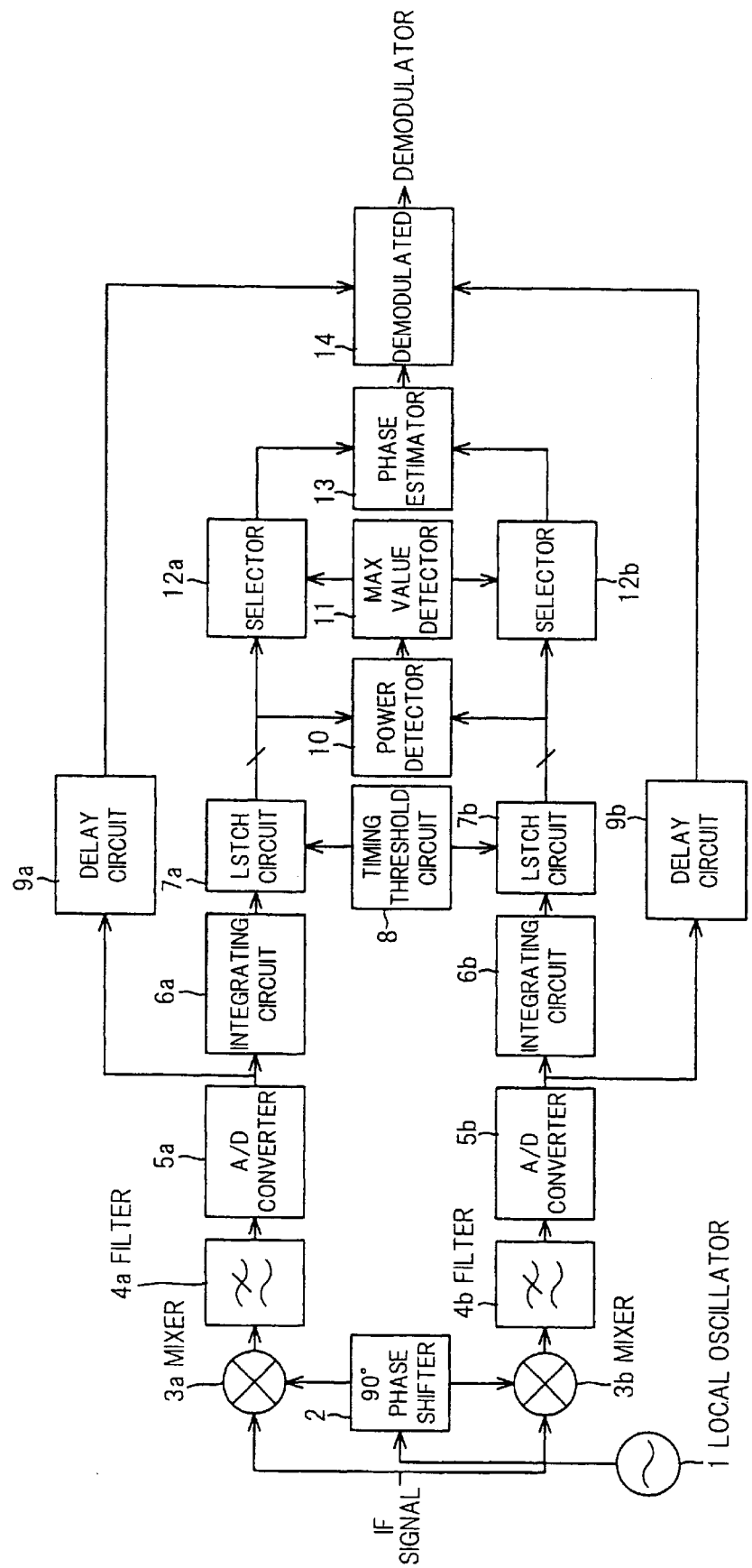
FIG. 1 is a schematic view of a burst demodulator to which the method for estimating a phase in a demodulator according to the invention is applied.

FIG. 1 shown a burst demodulator to which the method for estimating a phase in a burst demodulator according to the invention is applied. The burst demodulator comprises: a local oscillator 1; a 90° phase shifter 2; mixers 3a, 3b; filters 4a, 4b; A/D converters 5a, 5b; integrating circuits 6a, 6b; latch circuits 7a, 7b; a timing circuit 8; delay circuits 9a, 9b; a power detector 10; a maximum value detector 11; selectors 12a, 12b; a phase estimator 13; and a demodulator 14. In this drawing, a received IF signal is a signal obtained by modulating a received signal with QPSK (quadri phase shift keying).

Figure 2:
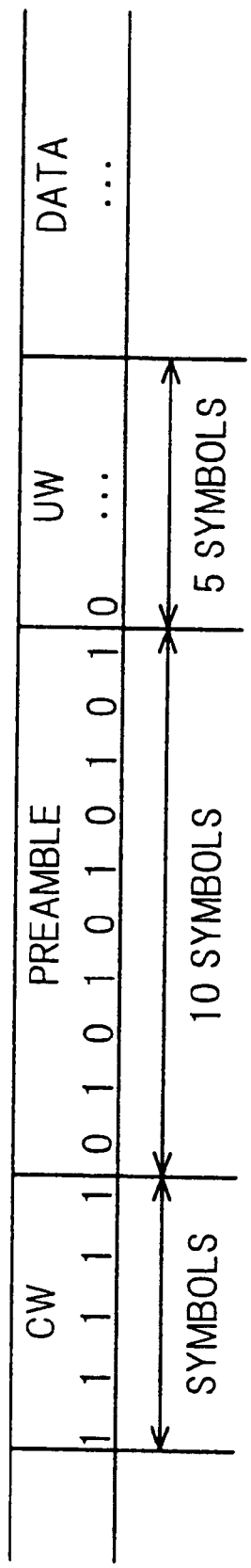
FIG. 2 is a diagram showing one embodiment of the construction of a frame of a received IF signal.

FIG. 2 shows one embodiment of the construction of a frame of a received IF signal. In FIG. 2, one frame comprises a CW (continuous wave) portion, a preamble portion, a UW (unique word) portion, and a data portion. In this case, for both the in-phase component and the orthogonal component, the CW portion is constituted by a pattern of 5 symbols of "11111", the preamble portion is constituted by a pattern of 10 symbols of "0101010101", the UW pattern is constituted by a fixed pattern of 5 symbols of "OXXXX" wherein X represents a desired random pattern and the data portion has a random pattern.

In FIG. 1, a signal from the local oscillator 1 is separated by the 90° phase shifter 2 into an in-phase component (0°) and an orthogonal component (90°). The in-phase component (0°) is multiplied by the received IF signal in the mixer 3a. On the other hand, the orthogonal component (90°) is multiplied by the received IF signal in the mixer 3b. Thus, pseudo-synchronous detection is carried out. The pseudo-synchronously detected signals are passed through filters 5a, 5b and subjected to A/D conversion in A/D converters 5a, 5b, and the preamble (10 symbols) portions (FIG. 2) are integrated for each sample in integrating circuits 6a, 6b.

Figure 3:
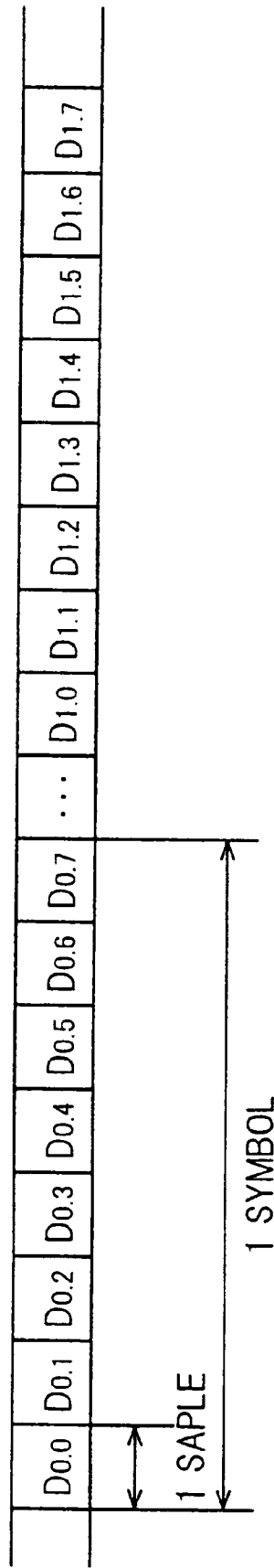
FIG. 3 is a diagram showing one embodiment of samples within one symbol.

FIG. 3 shows one embodiment of samples within one symbol. In FIG. 3, the integrated value for each sample S(j) (wherein j=0, . . . , 7) is expressed by the following numerical formula 1. In this embodiment, 8-fold sampling is carried.

$$S(j) = \sum_{i=0}^{9} Ci \cdot Di, j$$

Ci=1 (i mod 2≠0) or −1 (i mod 2=0) Next, the integrated signals are latched in the latch circuits 7a, 7b. The timing of the latch is controlled by the timing circuit 8. When the timing of the preamble portion is known, the latch is carried out at that timing. On the other hand, when the timing of the preamble portion is unknown, the latch is carried out at such a timing that the integrated signal has exceeded a predetermined threshold value.

The power detector 10 detects the power of the latched signals of the in-phase and orthogonal components, and the maximum value is detected in the maximum value detector 11. The timing at which the power becomes maximum is determined in selectors 12a, 12b. A phase (θ) is determined from the inverse tangent of the maximum value, and is used as an initial value of VCO in the demodulator 14.

In the case of samples shown in FIG. 3, the power detector 10 squares the in-phase component Sp(j) (wherein j=0, . . . , 7) and the orthogonal component Sq(j) (wherein j=0, . . . , 7) of the integrated value for each of the samples (8 samples), followed by addition of the squared values to determine the power P(j) (wherein j=0, . . . , 7).

$$P(j)=Sp(j)^2+Sq(j)^2$$

The maximum value detector 11 determines the maximum value of the powers P(j) (wherein i=0, . . . , 7) with respect to the 8 samples, and the timing at which the power becomes maximum (j=MAX) is determined in selectors 12a, 12b. In the phase estimator 13, a phase (θ)can be determined from the inverse tangent of the maximum integrated value of the timing.

$$\theta=ATAN(Sq(MAX)/Sp(MAX))$$

Figure 4:
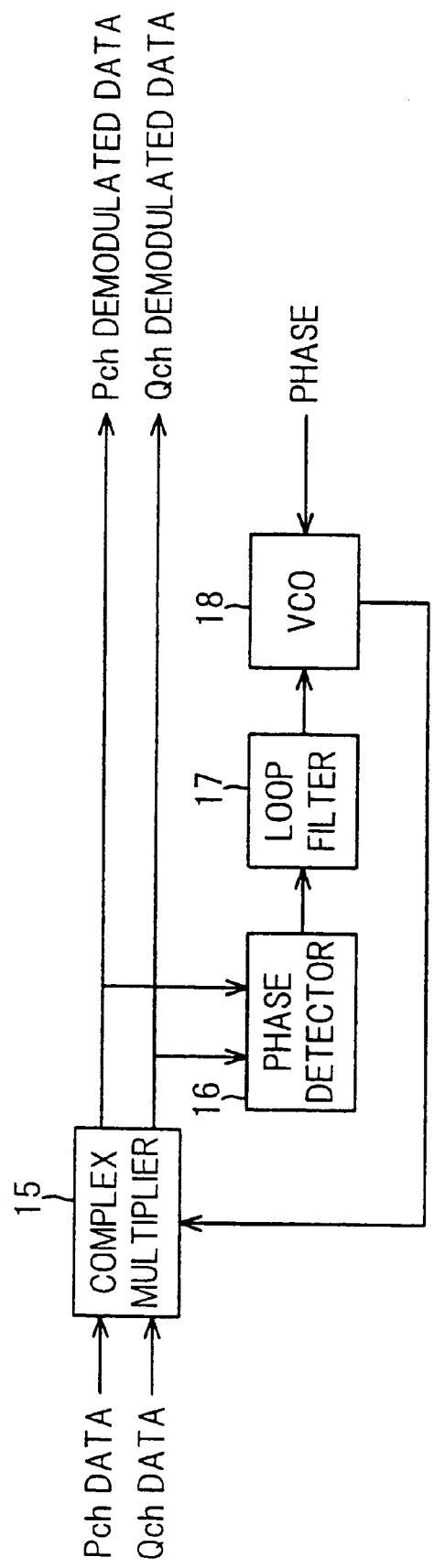
FIG. 4 is a diagram showing the construction of a demodulator.

FIG. 4 shows the construction of a demodulator. This demodulator 14 comprises a complex multiplier 15, a phase detector 16, a loop filter 17, and VCO 18 which constitute PLL (phase locked loop) Signals output from the A/D converters 5a, 5b (Pch data and Qch data) are delayed in the delay circuits 9a, 9b, and are input into the complex multiplier 15.

The signals output from the delay circuits 9a, 9b are passed through the complex multiplier 15 and then subjected to detection of phases in a phase detector 16, and only a predetermined phase component is extracted in a loop filter 17. This extracted phase component is input into VCO 18 to which the phase (θ) determined in the phase estimator 13 has been given as the initial value. The output from VCO 18 is fed back to the complex multiplier 15.

In the complex multiplier 15, the signals output from the delay circuits 9a, 9b are multiplied by the feedback signal from VCO 18. Therefore, use of the phase (θ) from the phase estimator 13 as the initial value of VCO in PLL in the demodulator 14 increases the pulling speed of PLL, contributing to stable demodulation of a burst signal.

The method for estimating a phase in a burst demodulator according to the invention has been described above. The threshold value of the timing circuit 8 can be variably set by averaging the received signal for each burst to determine the signal level.

Next, the operation of elements ranging from the integrating circuits 6a, 6b to the demodulator 14 in FIG. 1 will be described in more detail.

Figure 5:
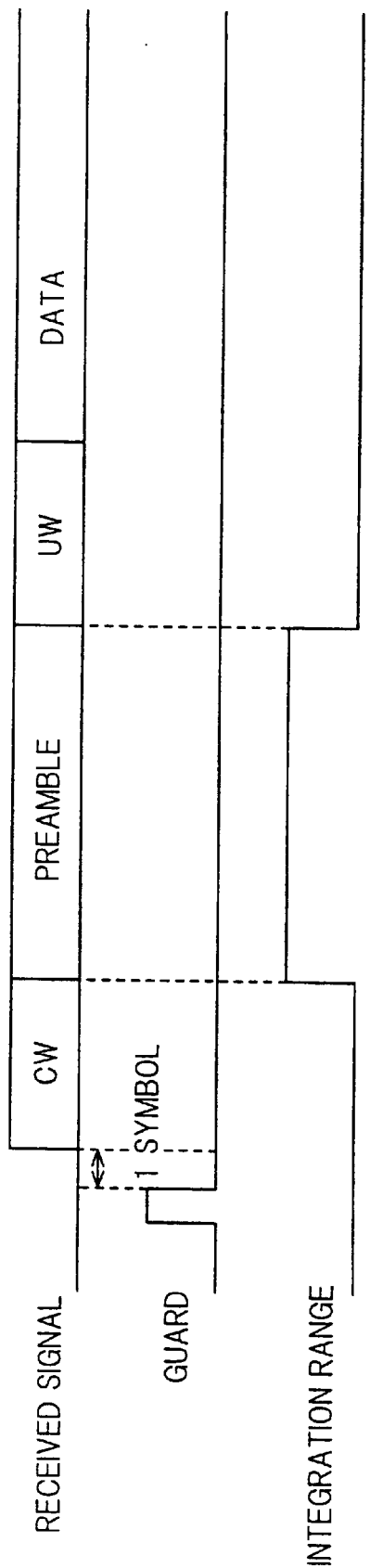
FIG. 5 is a diagram showing an integration range in the case where the timing of a burst signal is good.

FIG. 5 shows the integration range in the case where the timing of the burst signal is good. As shown in FIG. 5, when the burst signal has been acquired, GUARD timing is uniquely determined, making it possible to determine the position of PREAMBLE. Further, when the symbol before the preamble portion and the symbol after the preamble portion are made so as for the continuity of the pattern of "10" to be maintained, a deviation of ±1 bit in GUARD timing merely results in occurrence of the indeterminacy of the phase of (0, π) and does not affect the integrated value. Therefore, when accurate GUARD timing is known, the preamble portion is uniquely determined, so that the integration range can be determined as shown in FIG. 5.

In FIG. 1, power values are detected in the power detector 10 from the integrated values of eight in-phase components and orthogonal components for each sampling, and the maximum value is determined in the maximum value detector 11. That is, the timing of the maximum amplitude in the sampled burst signal is determined. Therefore, in the phase estimator 13, the phase (θ) can be determined from the inverse tangent of the in-phase component and the orthogonal component of the integrated value with respect to the timing corresponding to the maximum value. Utilization of the phase (θ) as the initial value of VCO in PLL of the demodulator increases the pulling speed and can realize stable demodulation of the burst signal.

Further, since the burst signal in its preamble portion is integrated and averaged to determine the phase, averaging of 10 symbols in the preamble portion as seen in the frame construction in FIG. 2 permits the phase (θ) of the sixth symbol in the preamble portion to be determined. Therefore, delaying of the burst signal in the delay circuits 91, 9b after A/D conversion in the A/D converters 5a, 5b followed by input into the demodulator 14 can realize the regulation of the timing of phase setting.

Figure 6:
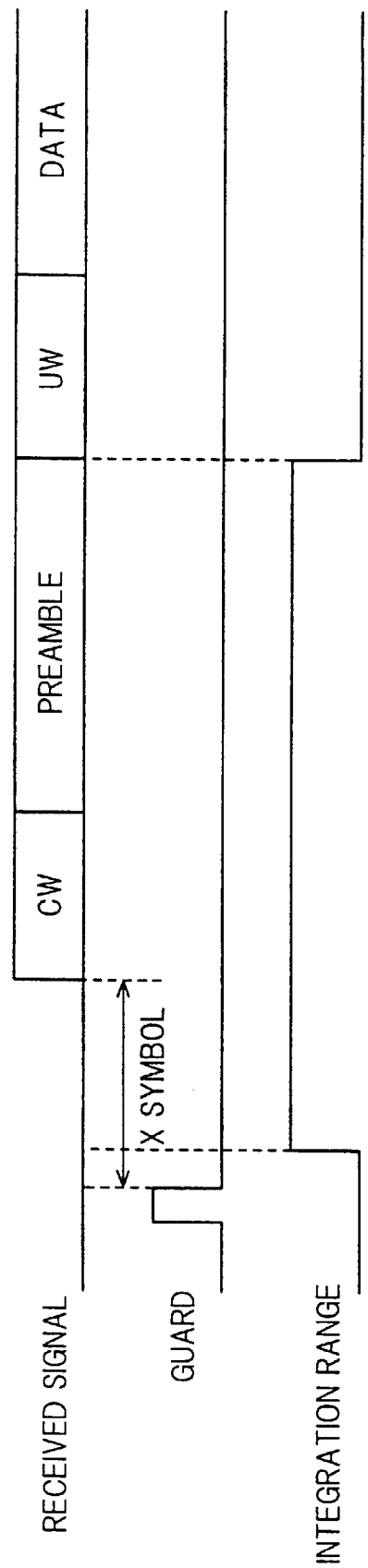
FIG. 6 is a diagram showing an integration range in the case where the timing of a burst signal is not good.

FIG. 6 shows the integration range in the case where timing of the burst signal is not good. As shown in FIG. 6, when the burst signal has not been acquired with GUARD timing being deviated by X symbols (X: an arbitrary number) the preamble portion cannot be accurately determined. In this case, in the integrating circuits 5a, 5b, integration is initiated from GUARD timing. When the value has exceeded a predetermined threshold value, the timing circuit 8 judges that the preamble portion has terminated followed by latching of the integrated values in the latch circuits 7a, 7b. The integrated values S(j) (wherein j=0, . . . , 7) expressed by the numerical formula 1 can be expressed by the following formula with noises Ni, j being taken into consideration.

Ci=1 (i mod 2≠0) or −1 (i mod 2=0)

$$S(j) = \sum_{i=0}^{K-1} Ci(Di, j + Ni, j)$$

(wherein j=0, . . . , 7)
wherein K represents the number of integrated symbols.

Therefore, when the average value of Ni,j is zero, in the non-signal portion (between GUARD signal and X symbol), Di, j=0. When the K value is large, the integrated value S (j) is approximately zero. Similarly, also in the CW portion, Di, j=1, and, when the K value is large, the integrated value S(j) is approximately zero. That is, when a certain threshold value is set and, for each burst, judgement is made in such a manner that, when the determined value has exceeded the threshold value, the preamble portion has terminated, the preamble portion can be equivalently integrated.

In this case, when the termination of the preamble portion is judged based on the threshold value, the optimal threshold value varies according to the difference in signal level and the like. Therefore, the threshold value may be varied depending upon the signal level. Here if both the UW portion and the DATA portion are constituted by random data, the integrated value S(j) is approximately zero when the K value is large. Therefore, when the integrated values are averaged for each burst and the number of times of averaging is increased, the signal level of the preamble portion can be approximately determined. Determination of the threshold value from the signal level makes it possible to determine a threshold value which has better suitability for the demodulation of the burst signal.

As described above, in the method for estimating a phase in a demodulator according to the invention, in order to reduce the size of the circuit, the preamble portion of the burst signal is serially integrated to determine correlation, based on which a phase is estimated. In this case, the position of the preamble portion should be known. After acquisition, the position of the preamble portion can be found out to some extent. At the stage of acquisition, the position of the preamble is unknown. Therefore, at the stage of the acquisition, the position of the preamble is approximately determined from the threshold value by utilizing the properties of the received signal. Further, the optimal threshold value varies depending upon the level of the received signal. Repetition of the integration for each burst to approximately determine the signal level of the preamble portion makes it possible to determine a threshold value having better suitability for the demodulation of the burst signal.

As is apparent from the foregoing description, in the method for estimating a phase in a demodulator according to the invention, in a demodulator for burst signals in radio communications, the preamble portion is serially integrated to determine correlation. This can eliminate the need to use a parallel correlator and hence can reduce the size of the circuit and the memory capacity. Further, even when the timing of the preamble portion is unknown, the threshold value is variably set by averaging the received signal for each burst through the utilization of the properties of the received burst signal to determine the signal level. This can realize accurate demodulation of the burst signal.

The invention has been described in detail with particular reference to preferred embodiments, but it will be understood that variations and modifications can be effected within the scope of the invention as set forth in the appended claims.

What is claimed is:

1. A method for estimating a phase in a demodulator, comprising the steps of: estimating a phase of a demodulated signal, obtained by demodulating a received signal, based on integrated values of the predetermined number of samples of a plurality of symbols constituting a preamble of the received signal; and feeding the phase of the demodulated signal as an initial phase into a voltage controlled oscillator (VCO) of a phase locked loop contained in a demodulator for outputting the demodulated signal (PLL).

2. A method for estimating a phase in a demodulator, comprising the steps of: pseudo-synchronously detecting a receive burst signal by an in-phase component and an orthogonal component of a local oscillation signal;

converting the pseudo-synchronously detected signals to digital signals;

integrating the digital signals with respect to the predetermined number of samples;

latching the signals integrated with respect to the predetermined number of samples at predetermined timing;

detecting the maximum value of the in-phase component and the orthogonal component in the latched signals; and estimating, from the maximum value, a phase to be used as an initial phase value of a phase locked loop (PLL) in a demodulator for the burst signal.

3. The method according to claim 2, wherein the latch is carried out at known timing of a preamble contained in the burst signal.

4. The method according to claim 2, wherein the latch is carried out at such a timing that the signal integrated with respect to the predetermined number of samples has exceeded a predetermined threshold value.

* * * * *